United States Patent
Kim et al.

(10) Patent No.: US 6,987,788 B2
(45) Date of Patent: Jan. 17, 2006

(54) HIGH POWER SEMICONDUCTOR LASER DEVICE

(75) Inventors: Chong Cook Kim, Seoul (KR); Ki Won Moon, Suwon (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 58 days.

(21) Appl. No.: 10/617,833

(22) Filed: Jul. 14, 2003

(65) Prior Publication Data

US 2004/0240504 A1    Dec. 2, 2004

(30) Foreign Application Priority Data

May 29, 2003  (KR) .................... 10-2003-0034346

(51) Int. Cl.
  *H01S 5/00*    (2006.01)
(52) U.S. Cl. ................... 372/45.01; 372/46.01
(58) Field of Classification Search .......... 372/45–46
  See application file for complete search history.

(56) References Cited

U.S. PATENT DOCUMENTS

| 6,185,237 B1 | 2/2001 | Fukuhisa et al. | |
| 2002/0039374 A1 * | 4/2002 | Onomura et al. | 372/46 |
| 2003/0031220 A1 * | 2/2003 | Takeuchi et al. | 372/45 |
| 2003/0210720 A1 * | 11/2003 | Reid | 372/46 |
| 2004/0028104 A1 * | 2/2004 | Buda et al. | 372/46 |
| 2004/0052282 A1 * | 3/2004 | Nakayama | 372/46 |

FOREIGN PATENT DOCUMENTS

| JP | 11-233833 | 8/1999 |
| JP | 2003-60315 | 2/2003 |
| WO | 97/50158 | 12/1997 |

OTHER PUBLICATIONS

Iordache et al. "High power CW output from low confinement asymmetric structure diode laser," Electronics Letters, Jan. 21, 1999, vol. 35, No. 2, p. 148-149.*

* cited by examiner

*Primary Examiner*—Minsun Oh Harvey
*Assistant Examiner*—James Menefee
(74) *Attorney, Agent, or Firm*—Lowe Hauptman & Berner, LLP (57) ABSTRACT

A high power semiconductor laser device includes a semiconductor substrate, a lower clad layer formed on the semiconductor substrate, a lower guide layer formed on the lower clad layer, an active layer formed on the lower guide layer, an upper guide layer formed on the active layer, and an upper clad layer formed on the upper guide layer. The lower and upper clad layers have the same refractivity. The lower clad layer includes a high refractivity layer, which is spaced from the lower guide layer by a constant distance, and has a refractivity higher than that of the upper clad layer.

19 Claims, 6 Drawing Sheets

PRIOR ART

FIG. 1

PRIOR ART

HIGH POWER SEMICONDUCTOR LASER DEVICE

BACKGROUND OF THE INVENTION

1. Field of the Invention

The present invention relates to a semiconductor laser device, and more particularly to a high power semiconductor laser device having a small far-field vertical angle (FFV) and excellent optical power efficiency.

2. Description of the Related Art

Generally, semiconductor laser devices are used as light sources in the information-processing and/or optical communication fields, and may be exemplified by an optical pick-up apparatus of an optical disk system such as a CD or DVD. Particularly, the information-processing field requires a technique for decreasing the beam size and increasing the optical density in order to increase the storage density. For example, a conventional semiconductor laser device for CDs has a FFV value of 35°, while a recent semiconductor laser device for CD-RWs should have a FFV value of approximately 14° to approximately 17°.

In order to manufacture such a semiconductor laser device, Japanese Patent Laid-open No. Hei 11-233883 discloses a semiconductor laser device having a nonsymmetrical refractive index profile.

This semiconductor laser device has an improved FFV value and assures higher power by decreasing the optical distribution at a ridged structure and shifting the optical distribution from the ridged structure toward a substrate via the vertically nonsymmetrical refractive profile centering on a nonsymmetrical active layer.

Figure 1:
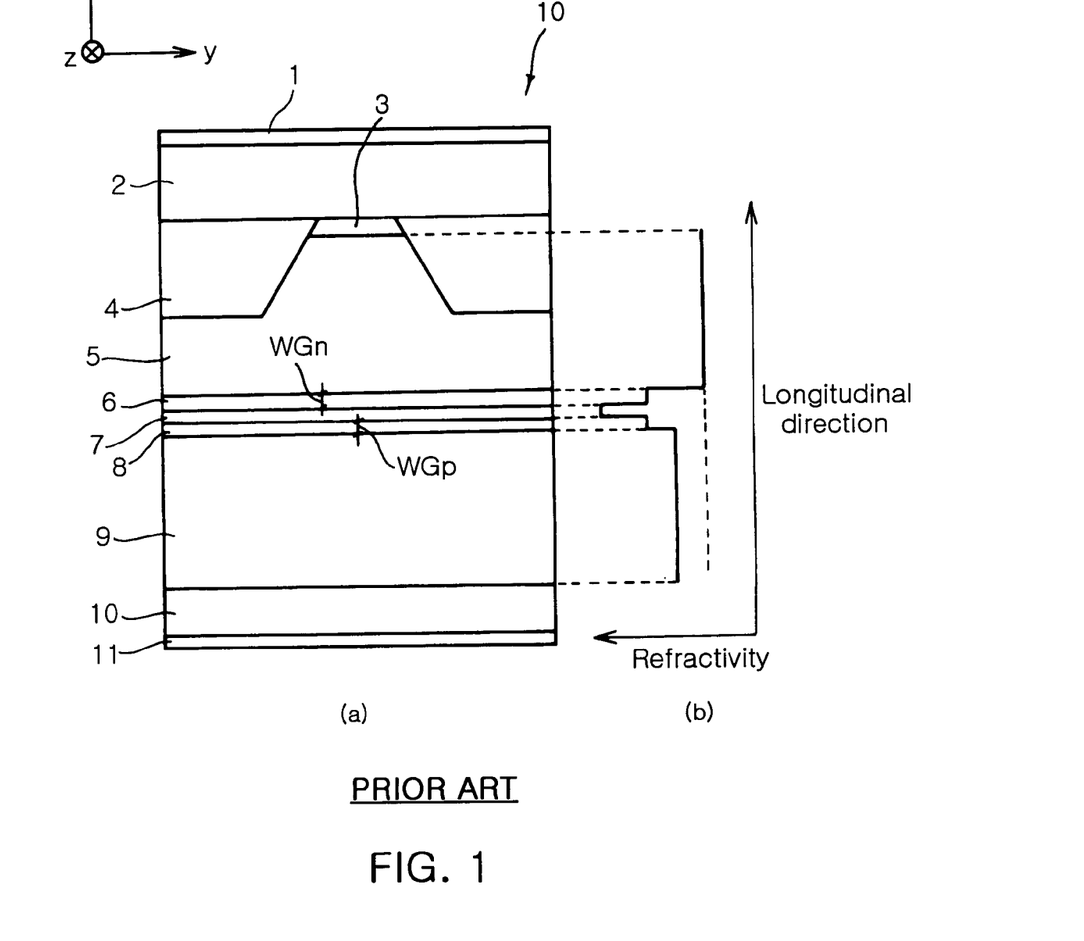
FIG. 1a is a cross-sectional view of a conventional semiconductor laser device.
FIG. 1b is a graph illustrating a refractive index profile of the conventional semiconductor laser device.

FIG. 1a is a cross-sectional view of this conventional semiconductor laser device. With reference to FIG. 1a, the semiconductor laser device comprises an n-type AlGaAs clad layer 9, a first guide layer 8, an AlGaAs active layer 7, a second guide layer 6 and a p-type AlGaAs clad layer 5, which are sequentially stacked on a GaAs substrate 10. The first and second guide layers 6 and 8 contact the upper and lower surfaces of the active layer 7, and are i(intrinsic)-AlGaAs guide layers with Al content higher than those of the active layer 7.

Here, the p-type AlGaAs clad layer 5 has a ridged structure so that current distribution is concentrated thereon, and a current block layer 4 for cutting off the distribution of the current is formed around the ridged structure.

A p-type GaAs cap layer 3 is formed on the upper surface of the ridged structure. A p-type GaAs layer 2 with a proper thickness is formed on the p-type GaAs cap layer 3 so that the effect of the p-type AlGaAs clad layer 5 on the active layer 7 occurring at a subsequent step is prevented by the p-type GaAs layer 2. A p-type electrode 1 is formed on the p-type GaAs layer 2, and an n-type electrode 11 is formed on the lower surface of the GaAs substrate 10.

Alternatively, an insulating layer instead of the p-type GaAs layer 2 may be formed on the current block layer 4 so that the p-type GaAs cap layer 3 is exposed to the outside, and the p-type electrode 1 may be formed on the insulating layer so that the p-type electrode 1 is electrically connected to the exposed portion of the p-type GaAs cap layer 3.

Figure 2:
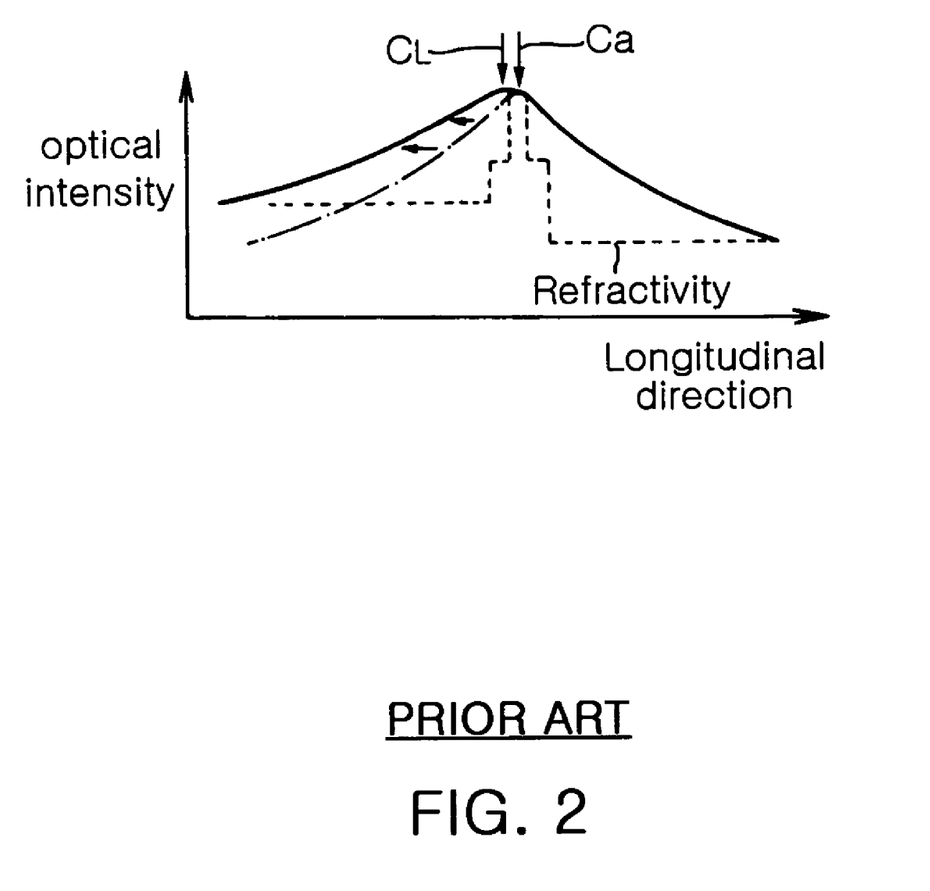

FIG. 1b is a graph illustrating a refractive index profile relative to the stacking direction of the semiconductor laser device shown in FIG. 1a, i.e., a longitudinal direction. As shown in FIG. 1b, the n-type AlGaAs clad layer 9 has refractivity higher than that of the p-type AlGaAs clad layer 5. That is, differently from the conventional semiconductor laser device with a symmetrical refractive index profile centering on an active layer, this semiconductor laser device has a nonsymmetrical refractive index profile. As shown in FIG. 2, the optical intensity distribution of the semiconductor laser device is improved by the above nonsymmetrical refractive index profile.

With reference to FIG. 2, the optical distribution of the semiconductor laser device is designed so that the light generated from the active layer 7, as indicated by arrows, is shifted from the n-type AlGaAs clad layer 9 toward the GaAs substrate 10. Accordingly, the optical distribution is decreased in the p-type AlGaAs clad layer 5 with relatively low refractivity, but increased in the n-type AlGaAs clad layer 9 on the substrate 10.

As a result, the FFV of the semiconductor laser device becomes narrow, and the aspect ratio (an angle in a longitudinal direction (x)/an angle in a transversal direction (z)) of the beam of the semiconductor laser device is reduced.

However, as shown in FIG. 2, since the center of the optical distribution, i.e., the position ($C_1$) of an optical peak, is shifted toward the GaAs substrate 10, the center of the optical distribution deviates from a central portion (Ca) of the active layer 7 and shifted to the n-type clad layer 9 with high refractivity. In case that the position ($C_1$) of the optical peak deviates from the central portion (Ca) of the active layer 7 generating light by recoupling electrons and holes, the gain efficiency is reduced, thus causing the decrease of optical power.

In order to solve this problem generated by the nonsymmetrical structure of the conventional semiconductor laser device, the refractivity of the second guide layer 6 disposed on the opposite side of the n-type clad layer 9 with high refractivity is heightened, or the thickness or band gap of the second guide layer 6 is increased more than that of the first guide layer 8.

However, such methods for adjusting the second guide layer may change the entire distribution of the laser device beam, or upset the balance of the ratio of holes and electrons injected into the active layer 7 via the p-type clad layer 5 with the ridged structure and the n-type clad layer 9, thus reducing the recoulping efficiency.

Accordingly, there is required a novel structure of a semiconductor laser device with an nonsymmetrical structure in order to reduce a FFV value, in which the deviation of the peak of optical intensity distribution from the central portion of an active layer due to an nonsymmetrical refractive index profile is prevented.

SUMMARY OF THE INVENTION

Therefore, the present invention has been made in view of the above problems, and it is an object of the present invention to provide a high power semiconductor laser device with an nonsymmetrical refractive index profile, in which the peak of optical intensity distribution is maintained at the central portion of an active layer, a FFV value is reduced, and optical efficiency is improved.

In accordance with the present invention, the above and other objects can be accomplished by the provision of a semiconductor laser device comprising: a semiconductor substrate; a lower clad layer formed on the semiconductor substrate; a lower guide layer formed on the lower clad layer; an active layer formed on the lower guide layer; an upper guide layer formed on the active layer; and an upper clad layer formed on the upper guide layer, wherein the lower and upper clad layers have the same refractivity, and the lower clad layer includes a high refractivity layer, spaced from the lower guide layer by a constant distance, with refractivity higher than that of the upper clad layer.

Preferably, the high refractivity layer may be spaced from the lower guide layer toward the side of the substrate by at least a distance corresponding to half of the total thickness of the upper and lower guide layers and the active layer.

Further, preferably, in order to dispose the center of the optical distribution on the central portion of the active area, the upper and lower guide layers may have the same thickness, or the upper and lower guide layers may have the same refractivity.

Preferably, the active layer may be made of an i-GaAs based material, the upper and lower guide layers may be made of an i-AlGaAs based material, the upper clad layer may be made of a p-type AlGaAs based material, and the lower clad layer may be made of an n-type AlGaAs based material.

Alternatively, preferably, the active layer may be made of an i-AlGaAs based material, the upper and lower guide layers may be made of an i-AlGaAs based material, the upper clad layer may be made of a p-type AlGaAs based material, and the lower clad layer may be made of an n-type AlGaAs based material.

Moreover, preferably, in case that the upper and lower guide layers are made of an i-AlGaAs based material, the high refractivity layer may be defined to have Al content (wt %) of approximately 0.85 to approximately 0.97 times as much as Al content of the lower clad layer, or of approximately 1.3 to approximately 2.5 times as much as Al content of the lower guide layer.

The semiconductor laser device may be divided into two aspects according to the structure of the lower clad layer.

In accordance with a first aspect of the present invention, there is provided a semiconductor laser device comprising: a semiconductor substrate; a first lower clad layer formed on the semiconductor substrate; a second lower clad layer formed on the first lower clad layer; a lower guide layer formed on the second lower clad layer; an active layer formed on the lower guide layer; an upper guide layer formed on the active layer; and an upper clad layer formed on the upper guide layer, wherein the second lower clad layer and the upper clad layer have a first refractivity, and the first lower clad layer has a second refractivity higher than the first refractivity.

In accordance with a second aspect of the present invention, there is provided a semiconductor laser device comprising: a semiconductor substrate; first, second and third lower clad layers sequentially formed on the semiconductor substrate; a lower guide layer formed on the third lower clad layer; an active layer formed on the lower guide layer; an upper guide layer formed on the active layer; and an upper clad layer formed on the upper guide layer, wherein the third lower clad layer and the upper clad layer have a first refractivity, and the second lower clad layer has a second refractivity higher than the first refractivity.

In order to reduce the FFV value, the present invention employs a nonsymmetrical structure, in which the refractivity of the lower clad layer is higher than the refractivity of the upper clad layer and the peak of the optical intensity of light generated from the active layer does not deviate from the central portion of the active layer.

In order to obtain the semiconductor device with a low FFV value (approximately 14°~17°), it is necessary to relatively increase the optical distribution toward the substrate by allowing the refractivity of the lower clad layer (for example, an n-type clad layer) to be higher than the refractivity of the upper clad layer (for example, a p-type clad layer). Here, since the optical intensity distribution is generally shifted toward the substrate, the peak of the optical intensity deviates from the central portion of the active layer.

This undesired shifting of the peak of the optical intensity is generated by the increasing the refractivity of the lower clad layer(mainly, the n-type clad layer). However, essentially, the change of the refractivity of the clad layer contacting the guide layer affects the shifting of the peak of the optical intensity. As results obtained by repeated experimental tests, it is known that the optical intensity distribution can be improved and the peak can be maintained at the central portion of the active layer by changing the refractivity of a portion corresponding to a tail of an optical distribution curve without adjusting the refractivity of the entire lower clad layer including a portion contacting the peak of the optical intensity.

For this reason, portions of the upper and lower clad layers contacting the guide layer may have the same refractivity as that of the guide layer, and the lower clad layer of the semiconductor laser device of the present invention may further comprise an additional clad layer with high refractivity spaced from the guide layer by a designated distance. Accordingly, it is possible to minimize the effect of the refractivity of the lower clad layer on the peak of the optical intensity and to increase the optical intensity at the high refractivity layer.

In order that the peak of the optical intensity does not deviate from the central portion of the active layer, the additional clad layer with high refractivity is separated from the lower guide layer by a designated distance. That is, in order that the peak of the optical intensity is not shifted, the thickness of the portions of the upper and lower clad layers contacting the guide layers must be minimized.

Preferably, the lower clad layer with the same refractivity as that of the upper clad layer may have a thickness of at least half of the total thickness of the upper and lower guide layers and the active layer. That is, the portion of the lower clad layer with high refractivity (the high refractivity layer) may be spaced from the lower guide layer by at least a distance corresponding to half of the total thickness of the upper and lower guide layers and the active layer.

Further, in case of the semiconductor laser device made of a GaAs based material, the refractivity of the additional lower clad layer may be defined only by Al content. The refractivity of the additional lower clad layer must be lower than the refractivity of the guide layer and higher than the refractivity of the upper clad layer so as to prevent the operation of a higher mode. Preferably, the additional lower clad layer may be defined to have Al content (wt %) of approximately 85% to approximately 97% of Al content of the lower clad layer (or the lower clad layer contacting the lower guide layer). When the Al content of the additional clad layer is higher than approximately 97% of the Al content (wt %) of the upper clad layer, the optical intensity distribution of the lower clad layer may not be sufficiently increased. When the Al content of the additional clad layer is lower than approximately 87% of the Al content (wt %) of the upper clad layer, the semiconductor laser device may be operated in a higher mode.

The preferred range of the Al content of the additional lower clad layer may be defined by the Al content of the lower guide layer. The Al content of the additional lower clad layer may be approximately 1.3 to 2.5 times as much as the Al content of the lower guide layer.

The semiconductor laser device of the present invention may be variously constituted. For example, the semiconductor laser device is variously constituted by the position of the additional lower clad layer, i.e., the structure of the lower clad layer including the high refractivity layer.

In accordance with the first aspect of the present invention, the lower clad layer includes the first lower clad layer, with high refractivity, formed on the substrate, and the second lower clad layer, with the same refractivity as that of the upper clad layer, formed on the first lower clad layer.

In accordance with the second aspect of the present invention, the lower clad layer includes the first lower clad layer formed on the substrate, the second lower clad layer, with high refractivity, formed on the first lower clad layer, and the third lower clad layer, with the same refractivity as that of the upper clad layer, formed on the second lower clad layer. The first lower clad layer may have the same refractivity as that of the third lower clad layer. Alternatively, the first lower clad layer may have refractivity being different from those of the second and third lower clad layers.

BRIEF DESCRIPTION OF THE DRAWINGS

The above and other objects, features and other advantages of the present invention will be more clearly understood from the following detailed description taken in conjunction with the accompanying drawings, in which:

FIG. 2 is a graph illustrating an optical intensity distribution relative to a longitudinal direction of the semiconductor laser device of FIG. 1a;

FIG. 4 is a graph illustrating an optical intensity distribution relative to a longitudinal direction of the semiconductor laser device of FIG. 3a;

FIG. 6 is a graph illustrating an optical intensity distribution relative to a longitudinal direction of the semiconductor laser device of FIG. 5a.

DESCRIPTION OF THE PREFERRED EMBODIMENTS

Now, preferred embodiments of the present invention will be described in detail with reference to the annexed drawings.

Figure 3:
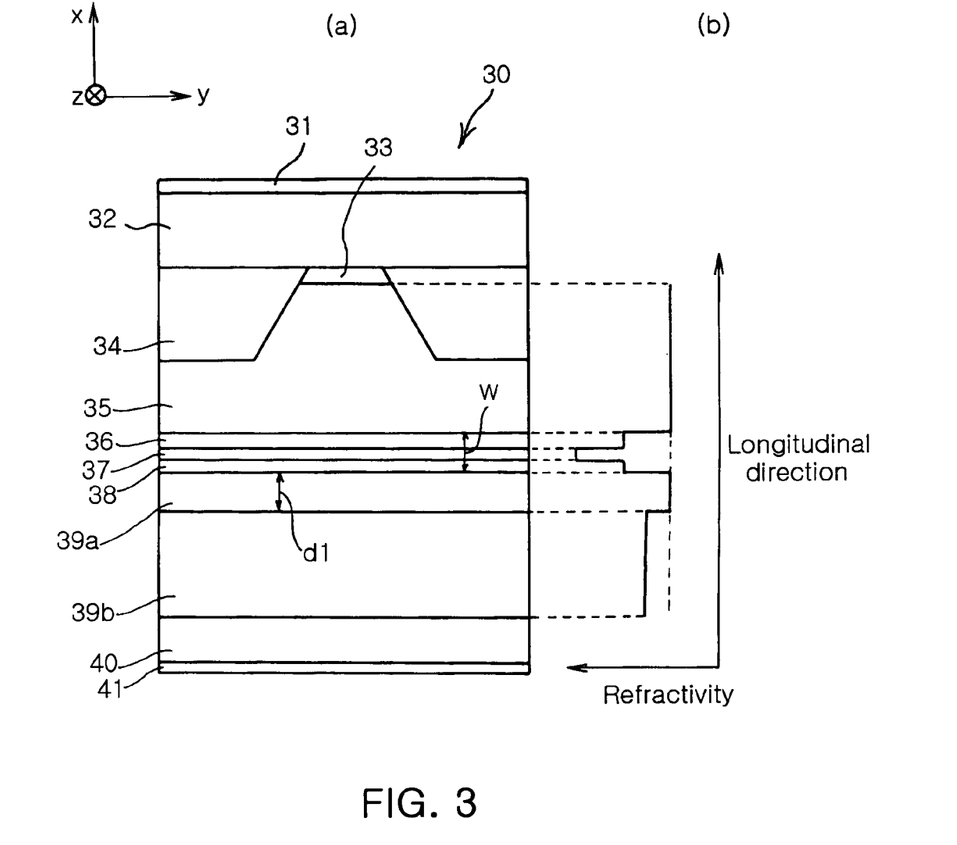
FIG. 3a is a cross-sectional view of a semiconductor laser device in accordance with one embodiment of the present invention.
FIG. 3b is a graph illustrating a refractive index profile of the semiconductor laser device in accordance with one embodiment of the present invention.

FIG. 3a is a cross-sectional view of a semiconductor laser device 30 in accordance with a first embodiment of the present invention.

With reference to FIG. 3a, the semiconductor laser device 30 comprises a first lower clad layer 39b, a second lower clad layer 39a, a lower guide layer 38, an active layer 37, an upper guide layer 36, and an upper clad layer 35, which are sequentially stacked on a semiconductor GaAs substrate 40. Similarly to the semiconductor laser device 20 shown in FIG. 1a, the upper clad layer 35 has a ridged structure so that current distribution is concentrated thereon, and a current block layer 34 for cutting off the distribution of the current is formed around the ridged structure. A p-type GaAs cap layer 33 is formed on the ridged structure. A p-type GaAs layer 32 with a proper thickness is formed on the p-type GaAs cap layer 33. A p-type electrode 31 is formed on the p-type GaAs layer 32, and an n-type electrode 41 is formed on the lower surface of the GaAs substrate 40.

In this embodiment, the first lower clad layer 39b is an n-type AlGaAs layer having a thickness of approximately 31 $\mu$m, in which Al content is 0.49 wt % and refractivity is approximately 3.3224. The second lower clad layer 39a is an n-type AlGaAs layer having a thickness (d1) of approximately 0.1 $\mu$m, in which Al content is 0.515 wt % and refractivity is approximately 3.3070. The upper clad layer 35 is a p-type AlGaAs layer having a thickness of approximately 2.2 $\mu$m, in which Al content is 0.515 wt % and refractivity is approximately 3.3070 the same as those of the second lower clad layer 39a.

In case that the active layer 37 is an InGaAs layer, the upper and lower guide layers 36 and 38 may be i-GaAs layers. However, in this embodiment in which the active layer 37 is an AlGaAs layer (with a thickness of approximately 22 nm), the upper and lower guide layers 36 and 38 are i-AlGaAs guide layers with a thickness of approximately 30 nm, in which Al content is 0.35 wt % and refractivity is approximately 3.42.

In this embodiment, the second lower clad layer 39a has the same refractivity (approximately 3.3070) as that of the upper clad layer 35 and the thickness (d1) of 0.1 $\mu$m larger than half (41 nm) of the total thickness (W) of the active layer 37 and the upper and lower guide layers 36 and 38. The first lower clad layer 39b has a refractivity (3.3224) smaller than the refractivity (3.420) of the upper and lower guide layers 36 and 38 and larger than the refractivity (3.307) of the upper clad layer 35 and the second lower clad layer 39a.

FIG. 3b is a graph illustrating a refractive index profile relative to a longitudinal direction. As shown in FIG. 3b, the optical distribution from the lower guide layer 38 toward the substrate 40 until the second lower clad layer 39a is symmetrical with the optical distribution from the upper guide layer 36 toward the p-type GaAs cap layer 33. However, since the first lower clad layer 39b has a refractivity larger than that of the upper clad layer 35, the optical distribution in the first lower clad layer 39b is nonsymmetrical with the optical distribution of the upper clad layer 35.

Figure 4:
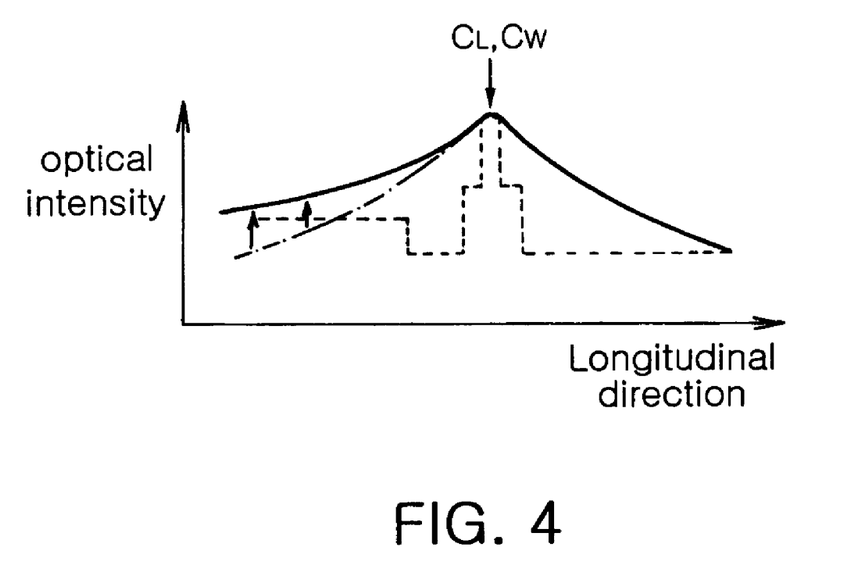

The optical intensity distribution of the semiconductor laser device 30 is improved by such a refractive index profile, as shown in FIG. 4.

With reference to FIG. 4, the optical distribution of the semiconductor laser device 30 illustrates that the light generated from the active layer 37 is almost unchanged at the central portion of the active layer 37 but is increased at the tail portion at the side of the substrate 40. The reason is that the second lower clad layer 39a contacting the lower guide layer 38 has the same refractivity as that of the upper clad layer 35 but the first clad layer 39b spaced from the lower guide layer 38 by a distance corresponding to the thickness of the second lower clad layer 39a has a relatively high refractivity.

As described above, a desired FFV value can be obtained and the center ($C_1$) of the optical distribution can nearly coincide with the central portion (Ca) of the active layer 37 using such a method for increasing the optical intensity at the tail portion of the optical distribution curve. Accordingly, it is possible to locate the center ($C_1$) of the optical distribution on the central portion (Ca) of the active layer 37 where electrons and holes are recoupled with each other, thus improving the optical power efficiency.

Figure 5:
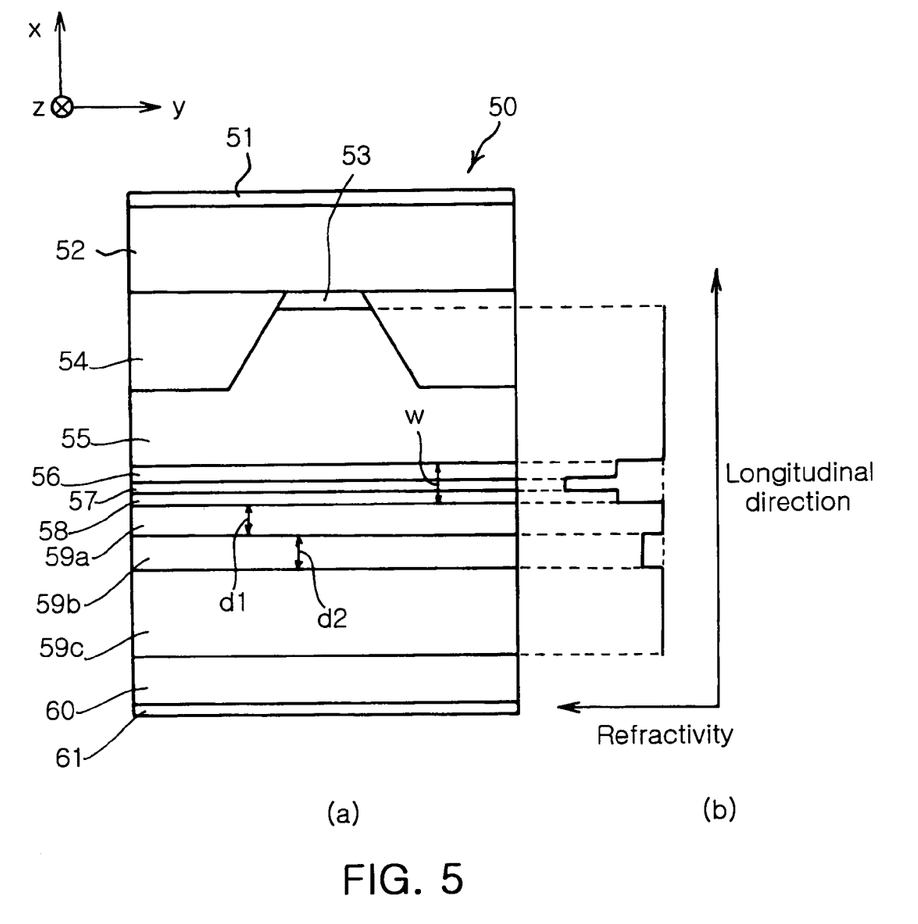
FIG. 5a is a cross-sectional view of a semiconductor laser device in accordance with another embodiment of the present invention.
FIG. 5b is a graph illustrating a refractive index profile of the semiconductor laser device in accordance with another embodiment of the present invention.

FIG. 5a is a cross-sectional view of a semiconductor laser device 50 in accordance with a second embodiment of the present invention.

With reference to FIG. 5a, the semiconductor laser device 50 comprises a first lower clad layer 59c, a second lower clad layer 59b, a third lower clad layer 59a, a lower guide layer 58, an active layer 57, an upper guide layer 56, and an upper clad layer 55, which are sequentially stacked on a semiconductor GaAs substrate 60. The upper clad layer 55 has a ridged structure so that current distribution is concentrated thereon, and a current block layer 54 for cutting off the distribution of the current is formed around the ridged structure. A p-type GaAs cap layer 53 is formed on the ridged structure. A p-type GaAs layer 52 with a proper thickness is formed on the p-type GaAs cap layer 53. A p-type electrode 51 is formed on the p-type GaAs layer 52, and an n-type electrode 51 is formed on the lower surface of the GaAs substrate 60.

In this embodiment, the first lower clad layer 59c is an n-type AlGaAs layer having a thickness of approximately 3.3 $\mu$m, in which Al content is 0.51 wt % and refractivity is approximately 3.308. The second lower clad layer 59b is an n-type AlGaAs layer having a thickness of approximately 0.5 $\mu$m, in which Al content is 0.47 wt % and refractivity is approximately 3.335. The third lower clad layer 59a is an n-type AlGaAs layer having a thickness (d1) of approximately 0.8 $\mu$m, in which Al content is 0.51 wt % and refractivity is approximately 3.308 the same as those of the first lower clad layer 59c.

The upper clad layer 55 is a p-type AlGaAs layer having a thickness of approximately 1.35 $\mu$m, in which Al content is 0.51 wt % and refractivity is approximately 3.308 the same as those of the third lower clad layer 59a. The upper and lower guide layers 56 and 58 may be i-GaAs layers contacting the upper and lower surfaces of the active layer 57. More particularly, the upper and lower guide layers 56 and 58 are i-AlGaAs guide layers with a thickness of approximately 30 nm, in which Al content is 0.35 wt % and refractivity is approximately 3.42. The active layer 57 is an AlGaAs layer with a thickness of approximately 22 nm.

In this embodiment, the third lower clad layer 59a has the same refractivity (approximately 3.308) as that of the upper clad layer 55 and the thickness (d1) of 0.8 $\mu$m larger than half (41 nm) of the total thickness (W) of the active layer 57 and the upper and lower guide layers 56 and 58.

The second lower clad layer 59b has a refractivity (3.335) smaller than the refractivity (3.42) of the upper and lower guide layers 56 and 58 and larger than the refractivity (3.308) of the upper clad layer 55 and the third lower clad layer 59a.

FIG. 5b is a graph illustrating a refractive index profile relative to a longitudinal direction.

As shown in FIG. 5b, similarly to the first embodiment shown in FIG. 3b, the optical distribution from the lower guide layer 58 toward the substrate 60 until the second clad layer 59b is symmetrical with the optical distribution from the upper guide layer 56 toward the p-type GaAs cap layer 53. However, since the second lower clad layer 59b has a refractivity larger than that of the upper clad layer 55, the optical distribution in the second lower clad layer 59b is nonsymmetrical with the optical distribution of the upper clad layer 55. The second lower clad layer 59b has a sufficient thickness (d2) for adjusting the optical distribution. As this embodiment, in case that the first lower clad layer 59c has the same refractivity as that of the third lower clad layer 59a, in order to obtain a desired FFV value, it is preferable to form the second lower clad layer 59b with a thickness at least two times as large as the total thickness of the active layer 57 and the upper and lower guide layers 56 and 58.

Figure 6:
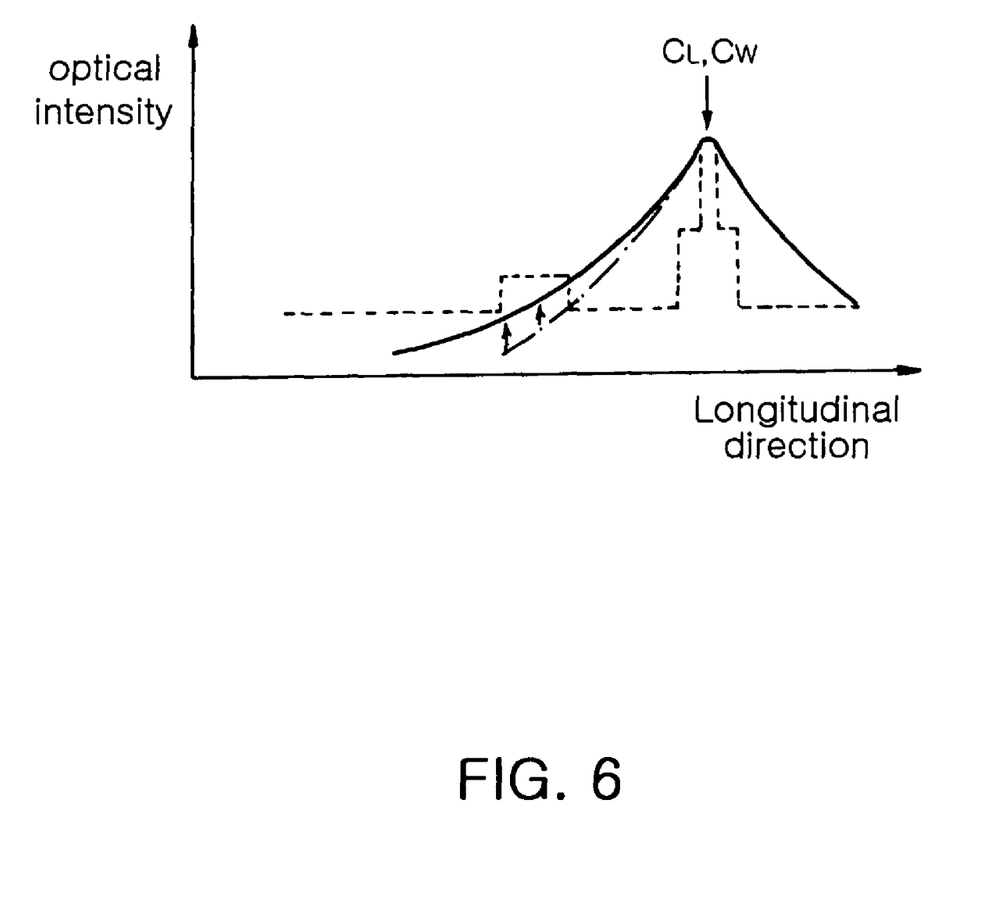

The optical intensity distribution of the semiconductor laser device 50 is improved by such a refractive index profile, as shown in FIG. 6.

With reference to FIG. 6, the optical distribution of the semiconductor laser device 50 illustrates that the light generated from the active layer 57 is almost unchanged at the central portion (Ca) of the active layer 57 but is increased at a middle portion at the side of the substrate 60. In case that the second lower clad layer 59b serving as a high refractivity layer is inserted in a band form into a lower clad structure, the third lower clad layer 59a contacting the lower guide layer 58 has the same refractivity as that of the upper clad layer 55 so that the central portion of the optical distribution is symmetrical, but the optical intensity is increased at a portion corresponding to the second lower clad layer 59b due to the high refractivity of the second lower clad layer 59b.

As described above, a desired FFV value can be obtained and the center ($C_1$) of the optical distribution can nearly coincide with the central portion (Ca) of the active layer 57 by adjusting the optical distribution using the second lower clad layer 59b with the above thickness and refractivity. Accordingly, it is possible to locate the center ($C_1$) of the optical distribution on the central portion of the active layer 57 where electrons and holes are recoupled with each other, thus improving the optical power efficiency.

In the above second embodiment, the first lower clad layer 59c has the same Al content and refractivity as those of the third lower clad layer 59a. However, the present invention is not limited thereto. In the present invention, in order to dispose the center of the optical distribution on the central portion of the active layer, only the upper clad layer 55 and the third lower clad layer 59a have the same refractivity, but it is unnecessary to design the first lower clad layer 59c to have the same refractivity as that of the third lower clad layer 59a. Accordingly, the first lower clad layer 59c may have refractivity higher than that of the third lower clad layer 59a, or may serve as an additional high refractivity layer for adjusting the optical intensity distribution.

As described above, the present invention may be achieved by two embodiments. In the first embodiment shown in FIGS. 3a and 3b in which the second lower clad layer 39a with high refractivity is disposed between the substrate 40 and the first lower clad layer 39b, a process for manufacturing the semiconductor laser device 30 is simple and the optical intensity distribution of the semiconductor laser device 30 is adjusted using only the refractivity of the first lower clad layer 39b and the thickness (d1) of the second lower clad layer 39a, thus easily obtaining a desired FFV value of the semiconductor laser device 30.

EXAMPLE

An experimental test for comparing the semiconductor laser device of the present invention with improved optical efficiency to the conventional semiconductor laser device was carried out so as to describe the improved characteristics of the semiconductor laser device of the present invention.

As shown in Table 2, a semiconductor laser device was designed and manufactured so that it has a FFV value of 17°, by a method similar to that for manufacturing the semiconductor laser device shown in FIGS. 5a and 5b.

TABLE 1

| Test example | Thickness(nm) | Al content(wt %) | Refractivity |
| --- | --- | --- | --- |
| Lower clad layer (n-AlGaAs) | 3,000 | 0.480 | 3.3287 |
| Lower guide layer (i-AlGaAs) | 15 | 0.350 | 3.4200 |
| Well layer (i-AlGaAs) | 8 | 0.100 | 3.5871 |
| Barrier layer | 6 | 0.350 | 3.4200 |
| Well layer (i-AlGaAs) | 8 | 0.100 | 3.5871 |
| Upper guide layer (i-AlGaAs) | 45 | 0.350 | 3.4200 |
| Upper clad layer (p-AlGaAs) | 2,200 | 0.515 | 3.3070 |

As shown in Table 1, a conventional semiconductor laser device was designed and manufactured so that it has a FFV value of 17°, by the conventional method for increasing the refractivity of a lower clad layer and the thickness of an upper guide layer.

TABLE 2

| Comparative example | Thickness(nm) | Al content(wt %) | Refractivity |
| --- | --- | --- | --- |
| First lower clad layer (n-AlGaAs) | 3,300 | 0.51 | 3.3083 |
| Second lower clad layer (n-AlGaAs) | 500 | 0.47 | 3.3352 |
| Third lower clad layer (n-AlGaAs) | 800 | 0.51 | 3.3083 |
| Lower guide layer (i-AlGaAs) | 30 | 0.35 | 3.4132 |
| Well layer (i-AlGaAs) | 8 | 0.105 | 3.6358 |
| Barrier layer | 6 | 0.35 | 3.4132 |
| Well layer (i-AlGaAs) | 8 | 0.105 | 3.6358 |
| Upper guide layer (i-AlGaAs) | 30 | 0.35 | 3.4132 |
| Upper clad layer (p-AlGaAs) | 1,350 | 0.51 | 3.3082 |

FFV values of the two semiconductor laser devices were measured at operating current (Ith), operating voltage (Vth), current (Iop) and voltage (Vop) of optical power of 90 mW. The results are shown in Table 3.

TABLE 3

|  | Test example | Comparative example |
| --- | --- | --- |
| FFV(°) | 17 | 17 |
| Ith(mA) | 30 | 53 |
| Vth(V) | 1.75 | 1.88 |
| Iop(mA) | 127 | 145 |
| Vop(V) | 2.1 | 2.2 |

As shown in Table 3, the semiconductor laser device of the test example of the present invention had a FFV value of 17° the same as the semiconductor laser device of the comparative example, and can be operated at voltage and current lower than those of the comparative example. Particularly, current (Iop) and voltage (Vop) required to obtain the optical power of 90 mA in the semiconductor laser device of the test example were lower than those in the semiconductor laser device of the comparative example.

That is, the semiconductor laser device of the test example had lower power consumption so as to obtain the same optical power as that of the semiconductor laser device of the comparative example, thus improving the optical power efficiency by approximately 20%.

Since the semiconductor laser device of the test example can dispose the center of the optical distribution on the central portion of the active layer as well as adjust the FFV value in a desired range, the recoupling efficiency of electrons and holes in the active layer was improved.

As apparent from the above description, the present invention provides a high power semiconductor laser device with nonsymmetrical refractive index profile for reducing FFV up to a desired range, in which the peak of optical intensity distribution is maintained within an active area, thus adjusting the refractive index profile, and improving the optical density and the optical power efficiency.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor laser device, comprising:
   a semiconductor substrate;
   a lower clad layer formed on the semiconductor substrate;
   a lower guide layer formed on the lower clad layer;
   an active layer formed on the lower guide layer;
   an upper guide layer formed on the active layer; and
   an upper clad layer formed on the upper guide layer,
   wherein the lower and upper clad layers have the same refractivity, and the lower clad layer includes a high refractivity layer, which is spaced from the lower guide layer by a constant distance and has a refractivity higher than that of the upper clad layer; and
   wherein the high refractivity layer has an Al content (wt %) of approximately 0.85 to approximately 0.97 times as much as an Al content of the lower clad layer.

2. The semiconductor laser device as set forth in claim 1, wherein the high refractivity layer is spaced from the lower guide layer toward the side of the substrate by at least a distance corresponding to half of the total thickness of the upper and lower guide layers and the active layer.

3. The semiconductor laser device as set forth in claim 1, wherein the upper and lower guide layers have the same thickness.

4. The semiconductor laser device as set forth in claim 1, wherein the upper and lower guide layers have the same refractivity.

5. The semiconductor laser device as set forth in claim 1, wherein the high refractivity layer is disposed between the lower clad layer and the semiconductor substrate.

6. The semiconductor laser device as set forth in claim 1, wherein the distance of the high refractivity layer spaced from the lower guide layer toward the side of the semiconductor substrate is less than 3 times as large as the total thickness of the upper and lower guide layers and the active layer.

7. The semiconductor laser device as set forth in claim 1, wherein the high refractivity layer is disposed in the lower clad layer.

8. The semiconductor laser device as set forth in claim 1, wherein the active layer is made of an i-GaAs based material, the upper and lower guide layers are made of an i-AlGaAs based material, the upper clad layer is made of a p-type AlGaAs based material, and the lower clad layer is made of an n-type AlGaAs based material.

9. The semiconductor laser device as set forth in claim 1, wherein the active layer is made of an i-AlGaAs based material, the upper and lower guide layers are made of an i-AlGaAs based material, the upper clad layer is made of a p-type AlGaAs based material, and the lower clad layer is made of an n-type AlGaAs based material.

10. A semiconductor laser device, comprising:
a semiconductor substrate;
a lower clad layer formed on the semiconductor substrate;
a lower guide layer formed on the lower clad layer;
an active layer formed on the lower guide layer;
an upper guide layer formed on the active layer; and
an upper clad layer formed on the upper guide layer, wherein
the lower clad layer includes a low refractivity layer, wherein said low refractivity layer and said upper clad layer have the same refractivity;
the lower clad layer further includes a high refractivity layer, which is spaced from the lower guide layer by a constant distance and has a refractivity higher than that of the upper clad layer; and
the high refractivity layer has an Al content (wt %) of approximately 1.3 to approximately 2.5 times as much as an Al content of the lower guide layer.

11. A semiconductor laser device, comprising:
a semiconductor substrate;
a lower clad structure formed on the semiconductor substrate;
a lower guide layer formed on the lower clad structure;
an active layer formed on the lower guide layer;
an upper guide layer formed on the active layer; and
an upper clad layer formed on the upper guide layer;
wherein
the lower clad structure comprises first and second lower clad layers;
the first lower clad layer and the upper clad layer have the same first refractivity;
the second lower clad layer is spaced from the lower guide layer by a constant distance and has a second refractivity higher than the first refractivity; and
the second lower clad layer has an Al content (wt %) of approximately 0.85 to approximately 0.97 times as much as an Al content of the first lower clad layer.

12. The semiconductor laser device as set forth in claim 11, wherein the lower clad structure further comprises a third lower clad layer.

13. The semiconductor laser device as set forth in claim 12, wherein the first lower clad layer has the same refractivity as that of the third lower clad layer.

14. The semiconductor laser device as set forth in claim 13, wherein
the third lower clad layer is formed on the semiconductor substrate;
the second lower clad layer is formed on the third lower clad layer;
the first lower clad layer is formed on the second lower clad layer; and
the lower guide layer is fanned on the first lower clad layer.

15. The semiconductor laser device as set forth in claim 11, wherein
the second lower clad layer is formed on the semiconductor substrate;
the first lower clad layer is formed on the second lower clad layer; and
the lower guide layer is formed on the first lower clad layer.

16. The semiconductor laser device as set forth in claim 11, wherein said distance is at least half of a total thickness of the upper and lower guide layers and the active layer.

17. The semiconductor laser device as set forth in claim 11, wherein the upper and lower guide layers have the same thickness or the same refractivity.

18. The semiconductor laser device as set forth in claim 11, wherein said distance is less than 3 times as much as a total thickness of the upper and lower guide layers and the active layer.

19. The semiconductor laser device as set forth in claim 11, wherein
the active layer is made of one selected from the group consisting of an i-GaAs based material and an i-AlGaAs based material;
the upper and lower guide layers are made of an i-AlGaAs based material;
the upper clad layer is made of a p-type AlGaAs based material; and
the lower clad structure is made of an n-type AlGaAs based material.

* * * * *